United States Patent [19]

Ho et al.

[11] Patent Number: 4,983,865
[45] Date of Patent: Jan. 8, 1991

[54] HIGH SPEED SWITCH MATRIX

[75] Inventors: Pang-Ting Ho, Mountain View; Sanjay B. Moghe, San Jose, both of Calif.

[73] Assignee: Pacific Monolithics, Sunnyvale, Calif.

[21] Appl. No.: 301,491

[22] Filed: Jan. 25, 1989

[51] Int. Cl.$^5$ .................... H03K 17/687; H03K 17/56
[52] U.S. Cl. .................... 307/571; 307/242; 307/241; 328/104; 328/105; 328/137; 328/152; 328/153
[58] Field of Search ............... 333/103, 100, 124; 328/156, 104, 105, 137, 152, 153; 307/271, 242, 241, 571

[56] References Cited

U.S. PATENT DOCUMENTS

| | | | |
|---|---|---|---|
| 3,598,908 | 8/1971 | Poulett | 328/156 |
| 3,665,320 | 5/1972 | Ohsawa et al. | 307/571 |
| 4,291,278 | 9/1981 | Quine | 333/128 |
| 4,511,813 | 4/1985 | Pan | 307/241 |
| 4,580,114 | 4/1986 | Upadhyayula | 307/571 |
| 4,808,938 | 2/1989 | Levinson | 328/156 |

Primary Examiner—Stanley D. Miller
Assistant Examiner—Richard Roseen
Attorney, Agent, or Firm—Edward B. Anderson

[57] ABSTRACT

A switch matrix for particular use in microwave monolithic integrated circuits has FET-based switch elements with at least a combined total of two gates. Embodiments include the use of single and dual gate FETs. A preferred embodiment includes cascode-coupled FETs in series with inductances between input and output terminals. The input is taken from an artificial transmission line formed of a plurality of series-coupled inductors or from the junctions of series-coupled pairs of mutually coupled inductors.

20 Claims, 8 Drawing Sheets

HIGH SPEED SWITCH MATRIX

FIELD OF THE INVENTION

This invention relates to electronic switches, and in particular to a high speed switch matrix having an FET-based switch element.

BACKGROUND OF THE INVENTION

A switch matrix provides switching between one or a plurality of input terminals and one or a plurality of output terminals. For microwave systems in particular, in order to provide the interconnectivity between multiple signal sources and loads, a switch matrix is required. For example, a high-speed switch matrix is used on space craft to provide interconnectivity among the multiple beam antennas. Key performance parameters for the switch matrix is insertion loss for the one connected path, isolation between inputs to the outputs for the nonconnected path(s) and switching speed of the switching elements from on-state to off-state.

Conventionally, PIN diodes or FETs have been used as the switching element in microwave integrated circuit (MIC) construction. The conventional elements in 50 ohm input and output circuits load down the transmission line in hybrid form and makes it narrow band for the switch matrix. With the advancement of monolithic microwave integrated circuits (MMICs), a new system architecture is desirable for the microwave switch matrix which has superior performance to conventional switch elements and is more simple in construction.

SUMMARY OF THE INVENTION

The present invention provides an FET-based switch element for a switch matrix which overcomes the limitations of conventional elements at microwave frequencies. In particular, it provides a switch matrix with switch elements that maintain broad bandwidth transmission and high speed switching.

In general terms, the present invention provides a switch matrix for coupling one or more input terminals to one or more output terminals. An input terminal is coupled to an output terminal by a controllable field effect transistor (FET) switch means. Each FET switch means has two gates. One gate is coupled to the input terminal and the other gate is coupled to a controller for controlling the coupling of the two terminals. The drain of the FET switch means is coupled to the output terminal. The two switch means may be in the form of one or more dual-gate FETs or two or more single-gate FETs.

In a preferred power-divider embodiment, the switch means comprises first and second FETs coupled in series, with the first FET having a common source and the second FET having a common gate. The terminal to which the first FET is coupled is an input terminal and the terminal to which the second FET is coupled is an output terminal.

In this push pull embodiment, the input terminal is coupled to ground through a series coupling of first and second pairs of mutually coupled inductors and a resistive load. A fifth inductor is coupled to the junction formed by the first pair of inductors and the first FET. A sixth inductor is coupled between the first and second FETs. A seventh inductor is coupled between the second FET and the first output terminal.

The first FET is coupled to a node between the first pair of mutually coupled inductors. A second pair of series connected FETs forming a second switch element are coupled between the input terminal and the second output terminal. These third and fourth FETs are connected in series with inductors like the first and second FETs. They are coupled to the input terminal by connection to a node joint between the second pair of mutually coupled inductors. In some applications mutually coupled inductors can be replaced by uncoupled inductors.

A controller is coupled to the gate of the second FET of each FET pair in the cascode configuration for generating a first control signal appropriate for coupling selectively the input terminal to the first output terminal, and coupled to the gate of the fourth FET for generating a second control signal appropriate for coupling selectively the input terminal to the second output terminal.

Such switch matrices have substantially improved performance as compared to conventional devices. The two-gate FET switches provide high speed switching over a broad microwave bandwidth. This is further enhanced by the lossy artificial transmission line formed by the lumped inductors. By making the input inductors mutually coupled, the bandwidth is further widened and there is better gain flatness between the channels and VSWR over the frequency band.

These and other features and advantages of the present invention will become apparent from a reading of the following detailed description in association with the accompanying drawings.

DETAILED DESCRIPTION OF PREFERRED EMBODIMENTS

Figure 1:
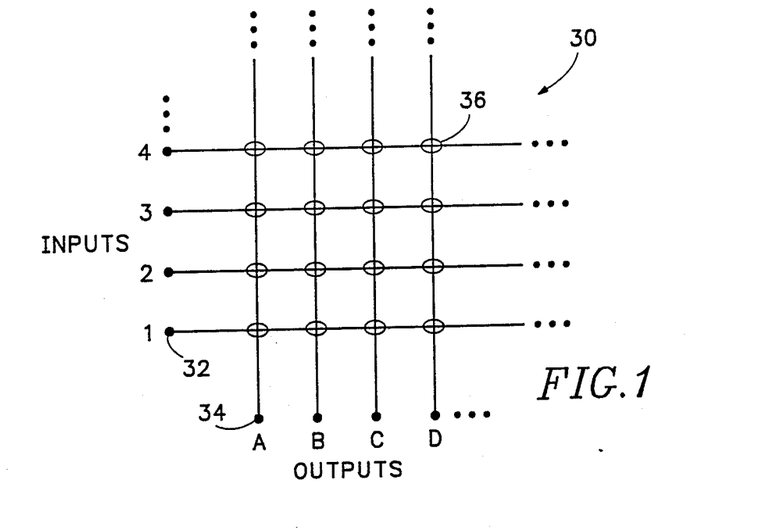
FIG. 1 is a simplified schematic showing a switch matrix for coupling selectively a plurality of inputs to a plurality of outputs.

Referring initially to FIG. 1, a cross-point switch matrix 30 is shown having a plurality of inputs 32 (1, 2, 3, 4, . . . ), a plurality of outputs 34 (A, B, C, D, . . . ) and corresponding switch elements 36 at each junction between an input line and an output line. Switch matrix 30 may be referred to as an N×M matrix having N inputs and M outputs.

Figure 2:
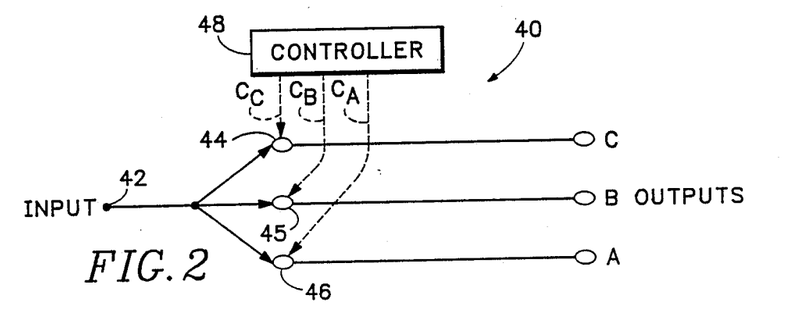
FIG. 2 is a simplified schematic showing a switch matrix for coupling selectively a single input to a plurality of outputs.

A 1×3 switch matrix 40 is shown in FIG. 2. Matrix 40 has a single input 42 and three outputs A, B and C. The input is coupled to each of the outputs via switch elements 44, 45 and 46. Each of these switch elements is controlled, respectively, by control signals $C_A$, $C_B$ and $C_C$ generated by a controller 48.

Figure 3:
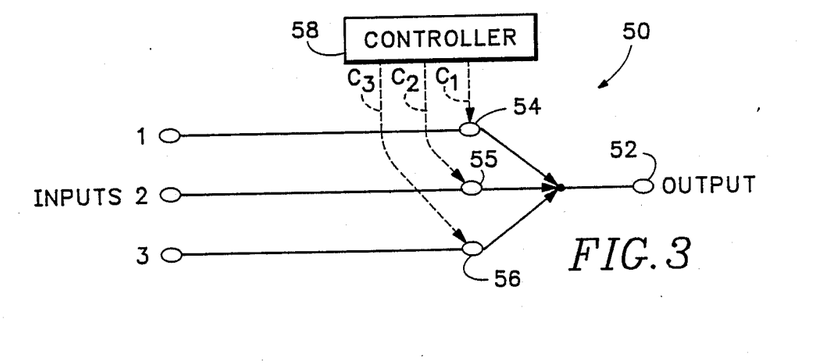
FIG. 3 is a simplified schematic showing a switch matrix for coupling selectively a plurality of inputs to a single output.

A 3×1 switch matrix 50 is shown in FIG. 3. Matrix 50 is reversed from switch matrix 40 and has three inputs 1, 2 and 3, a single output 52, and corresponding switch elements 54, 55 and 56. Control signals $C_1$, $C_2$ and $C_3$ are generated by controller 58 to couple selectively each of the inputs to the output.

In each of the switch matrices of FIGS. 1–3, a switch element is controllable to couple one input to one output. Thus, a switch element is used between each input and output that are to be coupled. Normally, the switch elements are controlled so that one input is coupled to one output at a time. It is desirable to have minimum signal transmission loss through the on-state switch element with minimal input and output mismatch. Correspondingly, the switch elements which are in the off-state should have maximum loss and minimum input and output mismatch.

Figure 4:
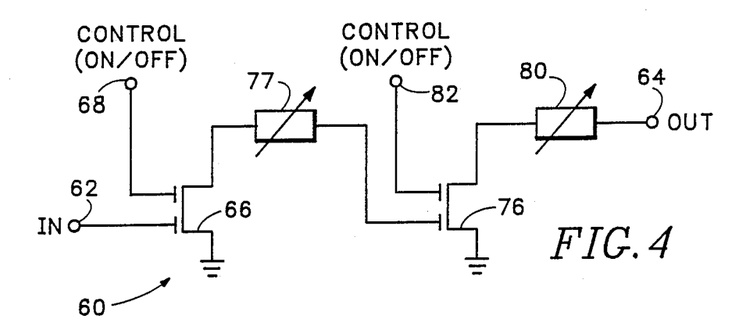
FIG. 4 is a block schematic showing a first preferred embodiment of a sWitch element made according to the invention and usable in the matrices of FIGS. 1–3.

FIG. 4 illustrates a first embodiment of an FET-based switch element 60 made according to the invention and having superior performance at microwave frequencies over conventional switch elements. Switch element 60 extends between a signal input terminal 62 and an output terminal 64. Input 62 is coupled to one gate of a dual-gate FET 66. The other gate is coupled to receive a control signal on a conductor 68.

FET 66 is coupled in series with an output dual-gate FET 76. The respective drains of the FETs are coupled through interstage matching circuits 77 and 80 of conventional construction, as shown. The second gate of FET 76 is also coupled to receive a control signal on a conductor 82. FETs 66 and 76 are either both turned on or both turned off by the control signals.

Figure 5:
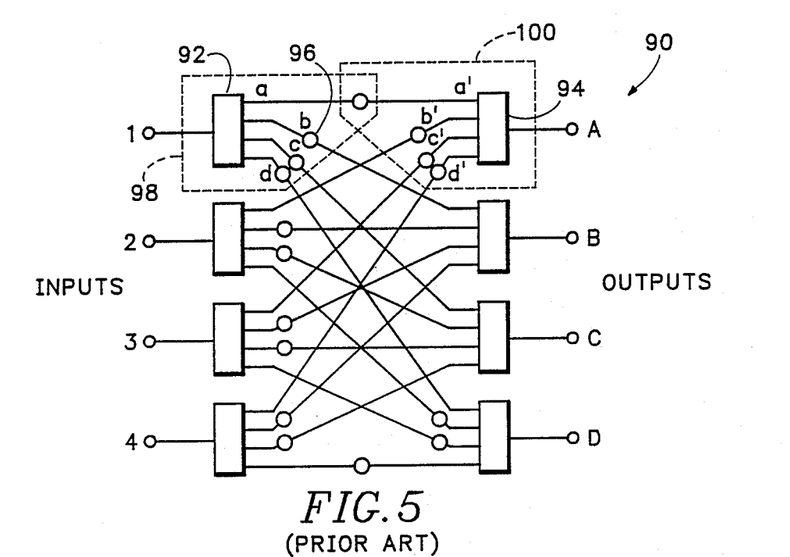
FIG. 5 is a simplified schematic showing a switch matrix for coupling power dividers with power combiners.

FIG. 5 illustrates another architecture of conventional form of a switch matrix 90 in which switch matrices made according to the present invention may be used. Each of a plurality of inputs 1, 2, 3 and 4 are fed into a power divider 92. Each power divider 92 has a plurality of outputs, such as outputs a, b, c and d, shown. Each power divider output is then fed to one of a plurality of power combiners, such as power combiner 94, through a switch 96. The power combiner inputs, identified as a', b', c' and d', are combined into a single output A, B, C or D.

Figures 6, 7:
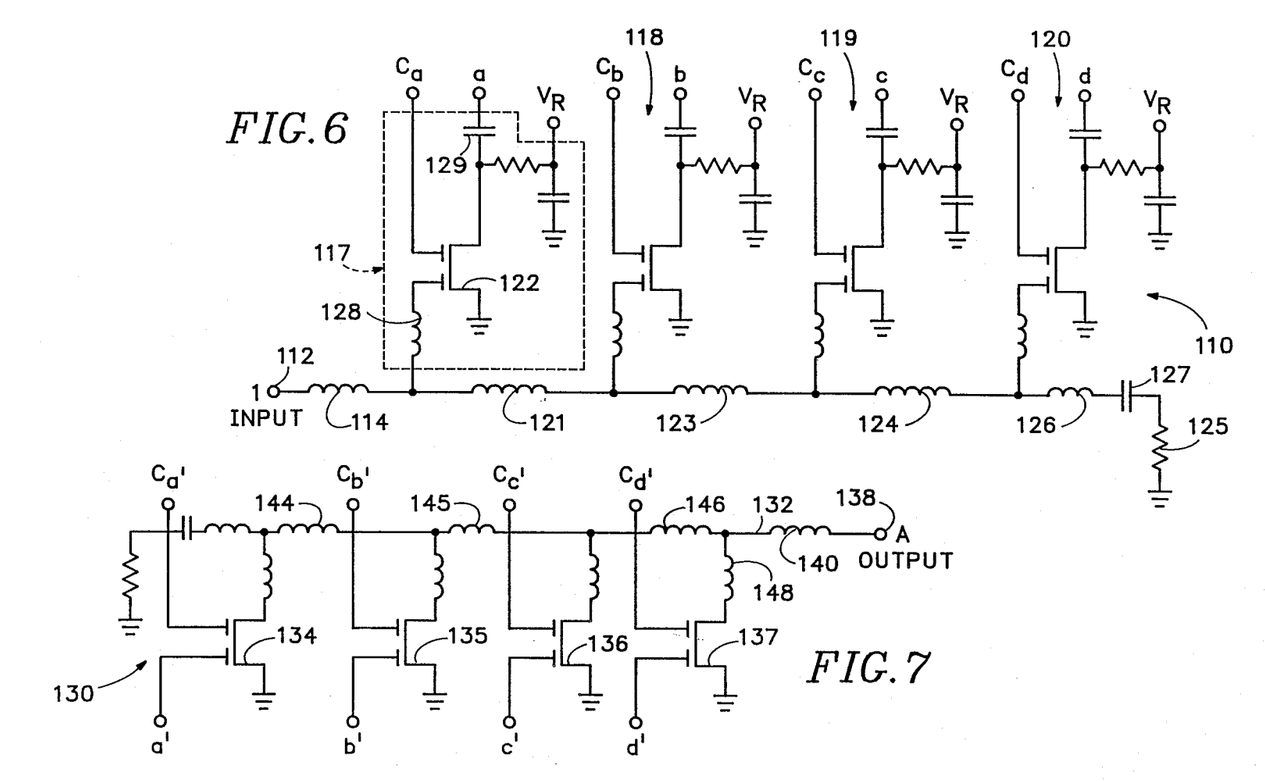
FIG. 6 is a schematic showing a preferred switch matrix which functions as a power divider.
FIG. 7 is a schematic showing a preferred switch matrix which functions as a power combiner.

Conventionally, power dividers are built with passive components in microstrip form and the switches are built with an active element, such as an FET or a PIN diode. In a preferred embodiment of the invention, the passive power divider and corresponding switches, shown as assembly 98, is replaced by an active element, such as shown in FIG. 6. Similarly, the assembly 100 comprising the switches and passive power combiner may be replaced with an active element such as shown in FIG. 7. These switch matrices may be fabricated as a monolithic integrated circuit, such as GaAs MMIC to achieve much wider bandwidth, superior isolation and insertion loss, smaller size and weight, and improved reliability.

This new active power divider switch matrix 110 is implemented as shown in FIG. 6. Switch matrix 110 comprises an input terminal 112 coupled to a gate of active switching elements 117, 118, 119 and 120 via an appropriate matching inductor 114. The input junctions between the switch elements are separated by input inductors 121, 123 and 124 which provide further circuit matching. Inductor 124 is also connected to a 50 ohm impedance 125 through inductor 126 and capacitor 127.

Each switch element, such as switch element 117, has a dual-gate FET 122, the source of which is coupled to the input via an inductor 128. The drain of FET 122 is coupled to the output, such as output a, via a DC-blocking capacitor 129. One gate of each of the FETs is coupled to receive a corresponding control signal, such as control signal $C_a$. The FET is thus turned on and off by the control signal. The input signal may thus be divided between a plurality of the outputs or be routed through a single output as determined by the control signals.

Similarly, assembly 100 may be replaced by the switch matrix 130 shown in FIG. 7. Separate inputs a', b', c' and d' are connected to an intermediate output conductor 132 through corresponding dual-gate FETs 134, 135, 136 and 137, respectively. The inputs are connected to one gate of the respective FET, and each control signal $C_{a'}$, $C_{b'}$, $C_{c'}$ and $C_{d'}$ is connected to the other gate of the respective FET, as shown. Conductor 132 is coupled to the output, shown as output A, on a terminal 138 via an inductor 140. The drains of FETs 134, 135 and 136 are connected through output inductors 144, 145 and 146 to conductor 132. The drain of each FET is connected through a matching inductor, such as inductor 148 associated with FET 137.

Figure 8:
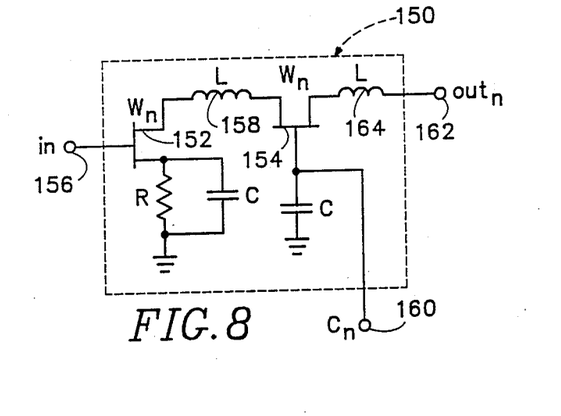
FIG. 8 is a schematic of a preferred switch element for a switch matrix made according to the invention.

An alternative form of switch element 150 for a channel n is shown in FIG. 8. Switch element 150 is similar to the switch elements described previously in that it comprises two FET gates with one gate coupled to receive the input signal and the other gate to receive the control signal. However, rather than using a dual-gate FET, two single-gate FETs 152 and 154 are used. The gate of FET 152 is coupled to an input terminal 156. The drain is coupled through an inductor 158 to the source of FET 154, the gate of which is coupled to receive a control signal on a conductor 160. The drain of FET 154 is coupled to an output terminal 162 through an inductor 164.

FET 152 has a common source and FET 154 has a common gate, resulting in them being arranged in a cascode configuration. The common gate provides control of the ON/OFF state of each channel by applying a negative voltage to the gate. The series inductor 158 helps to compensate for the gain rolloff at higher frequencies due to parasitic capacitances of the FETs. The length $W_n$ of the FET gates may be scaled to achieve amplitude match between the channels. Further, by using a distributed approach at the input and lossy matching at the output of each channel, close matching is achieved.

Figure 9:
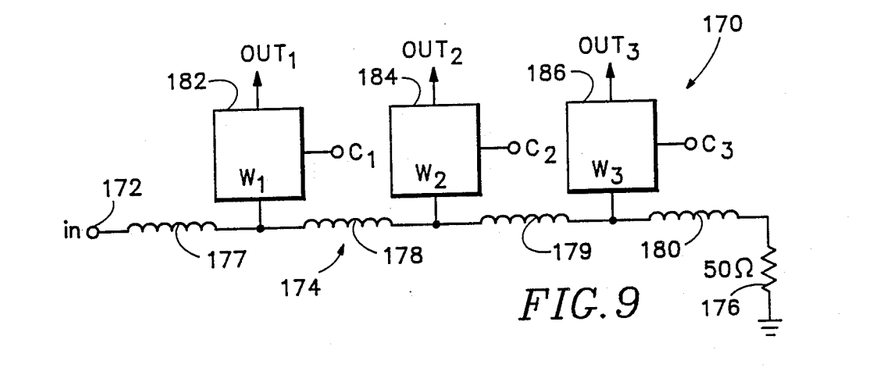
FIG. 9 is a block schematic illustrating a preferred 1×3 switch matrix using the element of FIG. 8.
Figure 10:
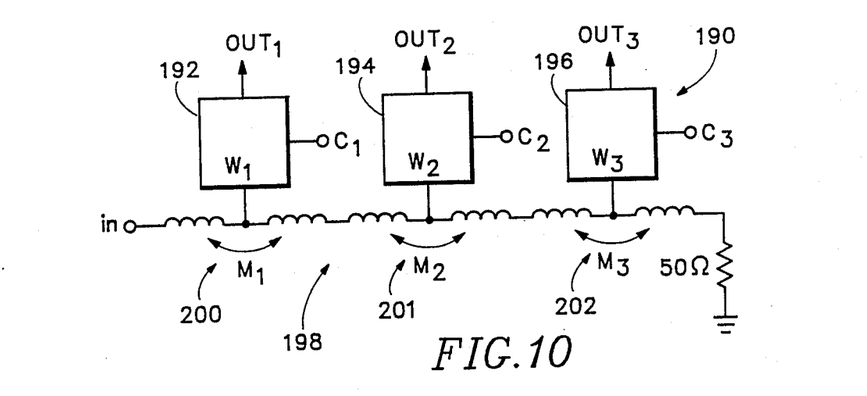
FIG. 10 is a block schematic illustrating another preferred 1×3 switch matrix using the element of FIG. 8 with mutually coupled inductors.
Figure 11:
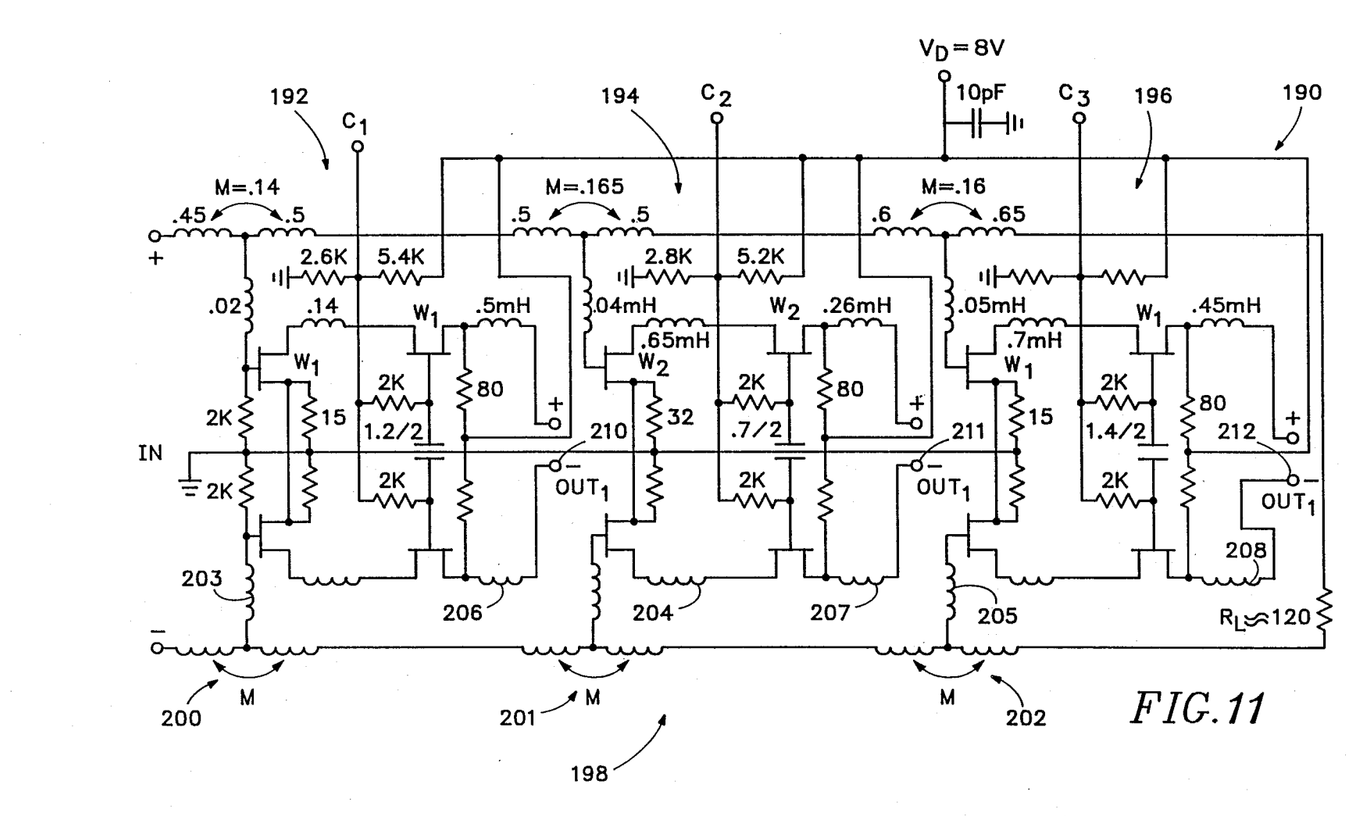
FIG. 11 is a detailed schematic of the switch matrix of FIG. 10.

Two versions of the switch matrices using the basic scheme of element 150 are shown in FIGS. 9 and 10, with a corresponding detailed schematic for FIG. 10 shown in FIG. 11. The gate capacitance ($C_{gs}$) of the input FET at each channel is absorbed into the artificial transmission line formed by adding lumped inductors and capacitors.

Referring to FIG. 9, a first embodiment forming switch matrix 170 using switch element 150 is shown. The input on a terminal 172 is coupled through artificial transmission line 174 to a characteristic impedance 176, typically of 50 ohms. Line 174 is formed of inductors 177, 178, 179 and 180 for a three-channel sWitch matrix. Switch elements 182, 184 and 186 are coupled to the respective junctions between inductors 177–180.

A switch matrix 190 similar to switch matrix 170 shown in FIG. 9 is illustrated in FIG. 10. Switch matrix 190 has switch elements 192, 194 and 196 of the same form as switch element 150 shown in FIG. 8. These switch elements correspond to respective transmission channels. An artificial transmission line 198, rather than being formed of a simple series connection of inductors, is formed of three pairs 200, 201 and 202 of mutually coupled inductors. Each channel is coupled to the input terminal by connection to the junction between two inductors forming each respective inductor pair.

The details of this circuit are shown in FIG. 11. In this schematic, a push-pull implementation is provided, so that each channel has a mirror-image switch element, as shown. Besides the inductors forming transmission line 198, a respective one of inductors 203, 204 and 205 is coupled in series with the input gate of the respective common-source FET. Also, inductors 206, 207 and 208 are coupled respectively in series between the drains of the corresponding common-gate FETs and the outputs appearing on terminals 210, 211 and 212.

Figure 12:
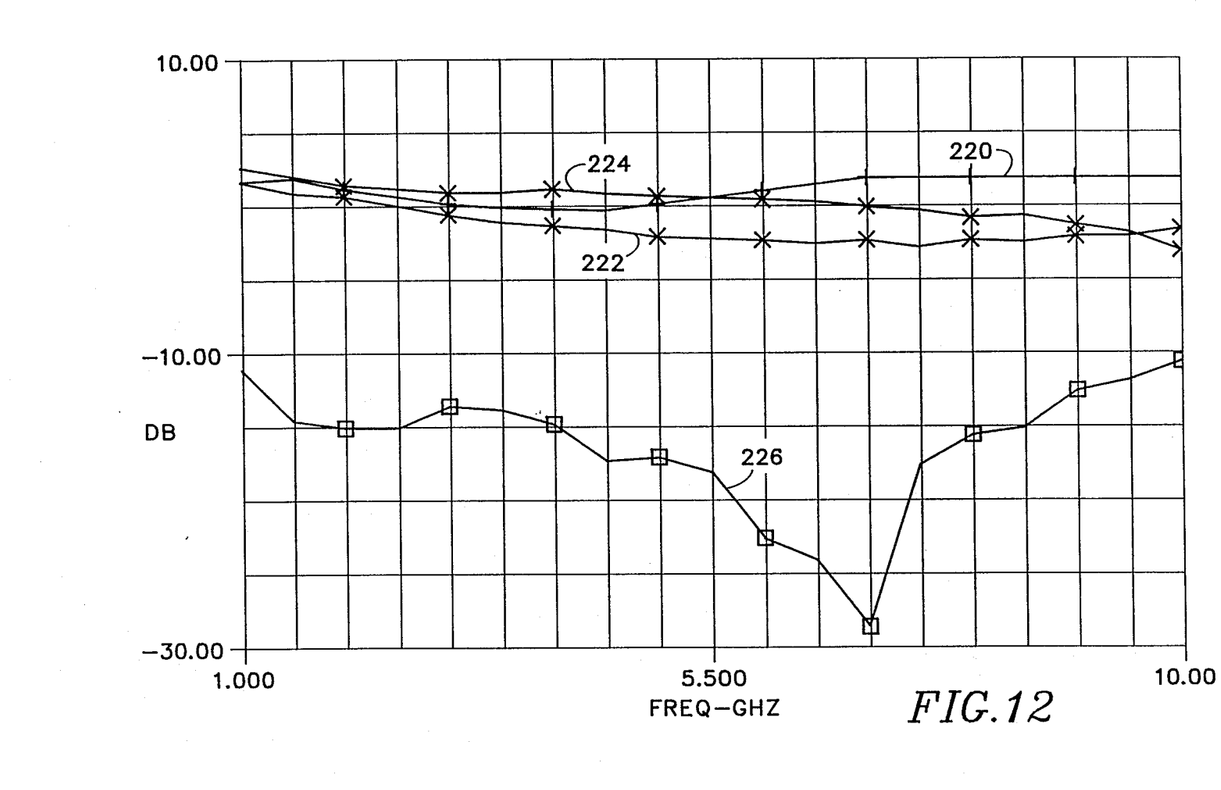
FIG. 12 is a chart of the measured on-state gain of the switch matrix of FIG. 11.

The measured on-state gain at the three channels and input return loss are shown in FIG. 12. Curves 220, 222 and 224 represent the measured on-state gain corresponding to switch elements 192, 194 and 196. These show gain to vary between approximately ±2 dB over most of the 1–10 GHz frequency range. Curve 226 represents the measured input return loss.

Figure 13:
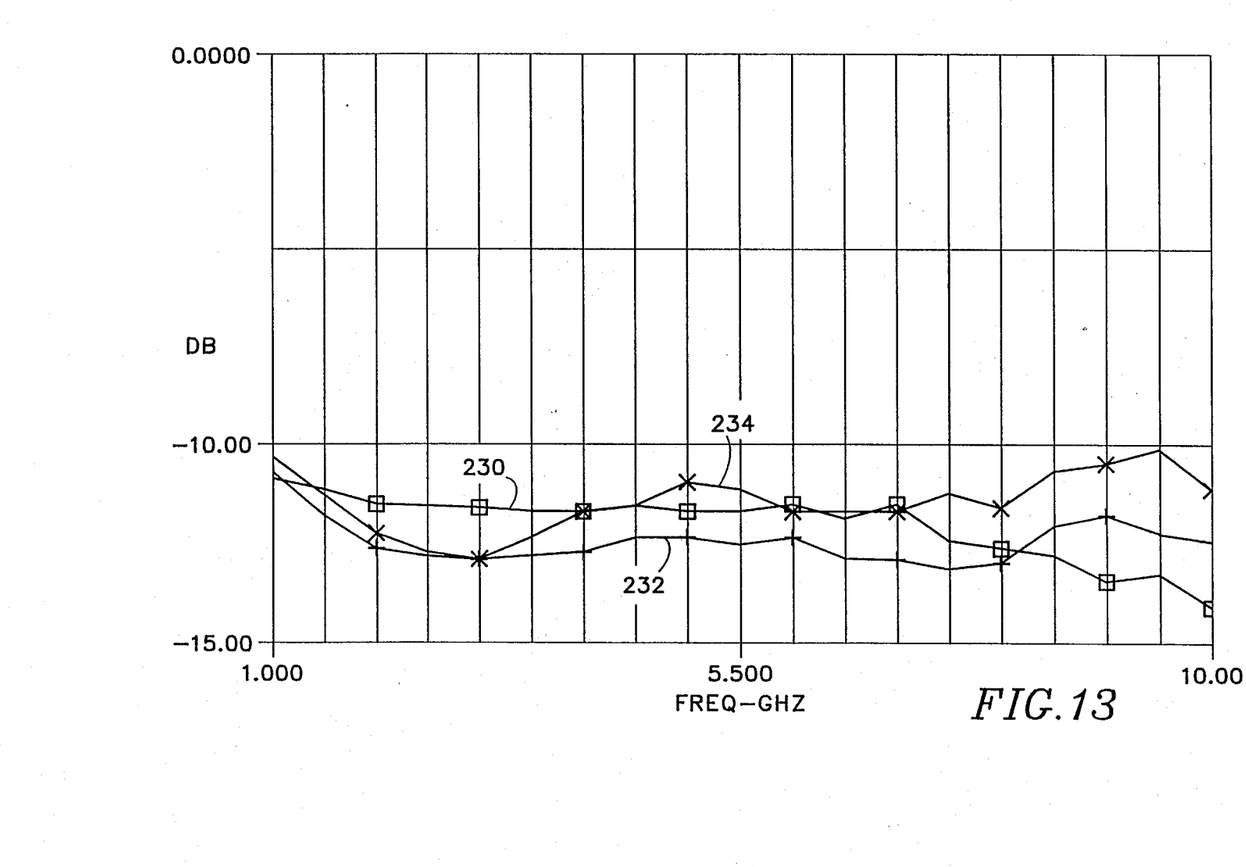
FIG. 13 is a chart of the measured on-state output return loss of the switch matrix of FIG. 11.

FIG. 13 illustrates the measured output return loss at the three channels associated with the switch matrix of FIG. 11. Curves 230, 232 and 234 represent the measured values. The measured loss varies between approximately −10 dB and −14 dB, that is, generally more loss than predicted.

Figure 14:
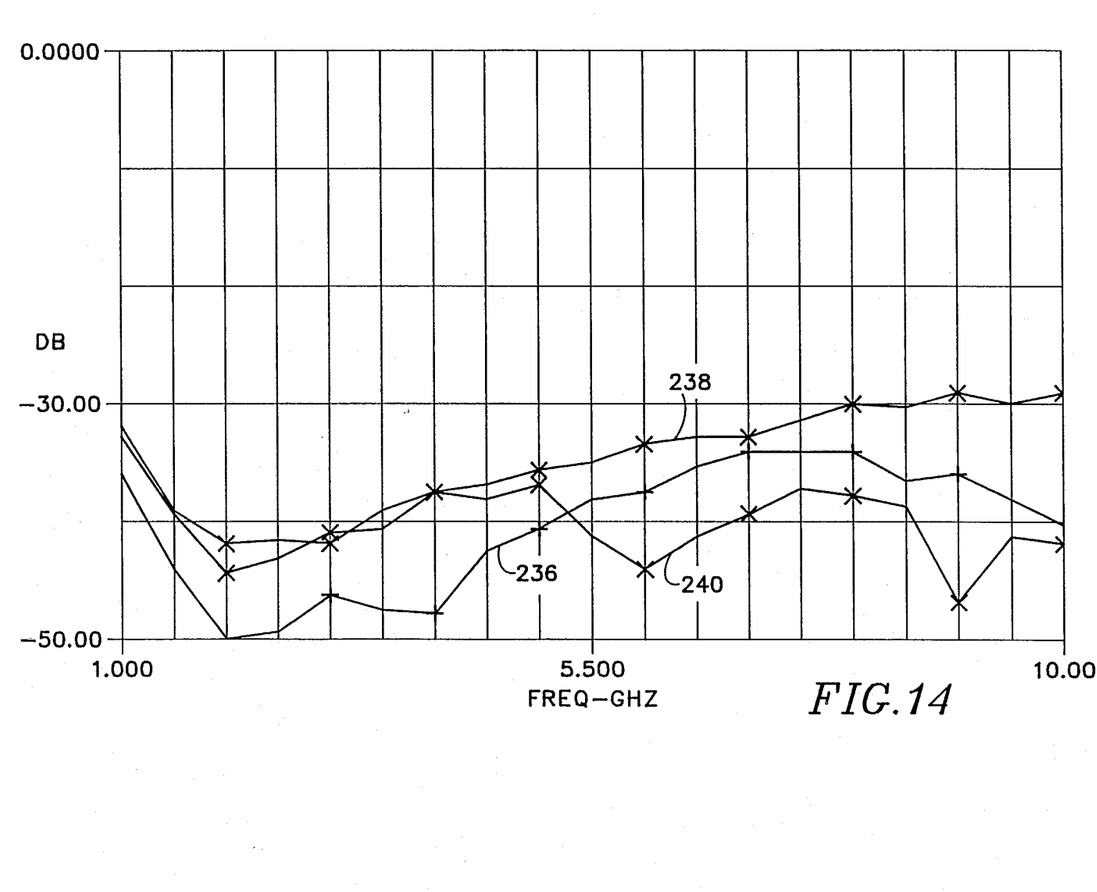
FIG. 14 is a chart of the measured off-state gain of the switch matrix of FIG. 11.

As a further illustration, the measured off-state gain at the three channels and input return loss are shown in FIG. 14. Curves 236, 238 and 240 show that the off-state gain corresponding, respectively, to switch elements 192, 194 and 196 generally varies between −30 dB and −50 dB.

Figure 15:
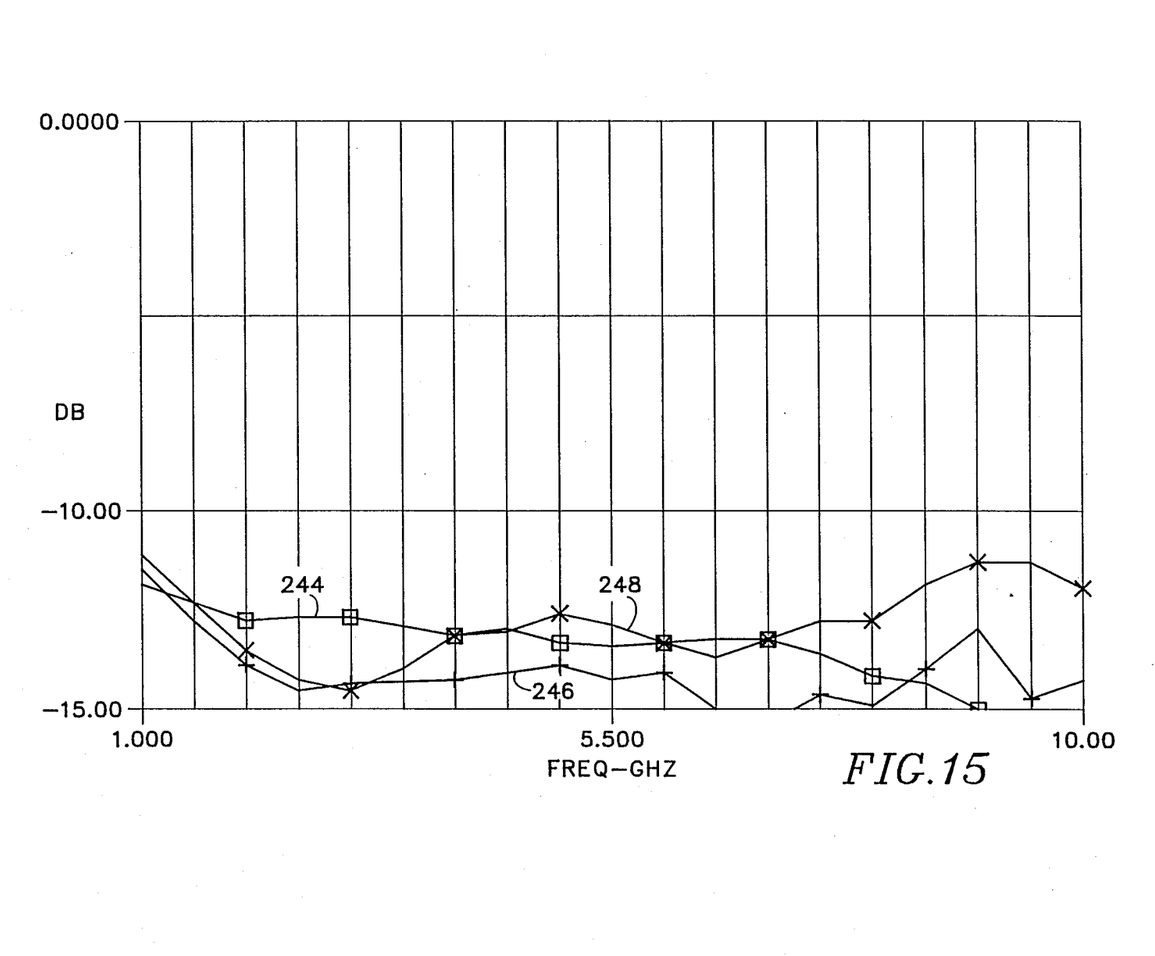
FIG. 15 is a chart of the measured off-state output return loss of the switch matrix of FIG. 11.

FIG. 15 shows the measured off-state output return loss at the three channels corresponding to switch elements 192, 194 and 196. This loss, as shown by curves 244, 246 and 248, is seen to vary between about −11 dB to −15 dB.

The measured responses were determined from an integrated circuit made of the embodiment of FIG. 11. The results do show a switch matrix which is operable at microwave frequencies and which has favorable performance, making it an effective way to achieve switching in an MMIC environment.

Several embodiments of FET-based switch elements having two gates for switch matrices have been described. Even though the measured results are shown on push-pull switch matrices, a similar approach can be taken for a single ended design. Similarly, with this approach the switch matrices can be designed for two or more inputs and outputs.

The switch matrix topologies shown here are ideal for MMIC implementation at high microwave and millimeter wave frequencies since parasitic capacitances of the FETs can be absorbed easily into artificial transmission lines made of monolithic inductors and FET capacitors. Thus, at high frequencies the insertion loss, VSWR and bandwidth of MMIC switch matrices can be improved with this approach. It will therefore be appreciated that other designs may also exist which do not vary form the spirit and scope of the invention as defined in the claims.

We claim:

1. A switch matrix, usable with control means generating switch control signals, comprising:
   an input terminal and first and second output terminals;
   first field-effect transistor (FET) switch means controllable for coupling selectively said input terminal to said first output terminal, and having two gates and a drain, a first of said gates of said first FET switch means being coupled to said input terminal, the second of said gates of said first FET switch means being connectable to the control means for receiving a control signal, and said drain of said first FET switch means being coupled to said first output terminal; and
   second field-effect transistor (FET) switch means also having two gates and a drain, a first of said gates of said second FET switch means being coupled to said input terminal, the second of said gates of said second FET switch means being connectable to the control means for receiving a control signal, and said drain of said second FET switch means being coupled to said second output terminal.

2. A matrix according to claim 1 wherein each of said first and second FET switch means comprises a first dual-gate FET means.

3. A matrix according to claim 2 wherein each of said first and second FET switch means further comprise a second dual-gate FET means coupled in series with said first FET means, and having a first gate coupled to the drain of said first dual-gate FET means, a second gate connectable to the control means for receiving a control signal, and a drain coupled to said respective output terminal.

4. A matrix according to claim 1 wherein said first and second FET switch means each further comprises a pair of series-connected single-gate FET means, each having a gate, source and drain, with said gate of a first of said single-gate FET means being coupled to said input terminal, said source of said first single-gate FET means coupled to ground, said drain of said first single-gate FET means coupled to said source of the second of said single-gate FET means, said gate of said second single-gate FET means connectable to the control means for receiving a control signal, and said drain of said second single-gate FET means coupled to the respective one of said first and second output terminals.

5. A matrix according to claim 4 wherein each of said FET switch means further comprises inductor means coupled in series between said drain of said first FET means and said source of said second FET means.

6. A matrix according to claim 1 further comprising a first inductor means coupling said input terminal to said first gate of said first FET switch means, and a second inductor means coupled said input terminal, through said first inductor means, to said first gate of said second FET switch means.

7. A matrix according to claim 6 further comprising third inductor means connected in series with said first and second inductor means for coupling said input terminal to ground, with said third inductor means being coupled to said input terminal through said first and second inductor means.

8. A matrix according to claim 6 further comprising third and fourth inductor means connected in series with said first and second inductor means for coupling said input terminal to ground, with said first and second inductor means being mutually coupled and said third and fourth inductor means being mutually coupled.

9. A switch matrix, usable with a control means generating switch control signals, comprising:
an input terminal and first and second output terminals;
a first pair of mutually coupled inductor means, a second pair of mutually coupled inductor means, and impedance means serially connected for coupling said input terminal to ground, with each pair of inductor means joining at a node;
first switch means controllable for coupling selectively said input terminal to said first output terminal, said first switch means comprising first and second field effect transistor (FET) means coupled in series between said input terminal and said first output terminal, said first FET means having a common source, a gate coupled to said input terminal, and a drain, and said second FET means having a common gate connectable to the control means for receiving a control signal, a source coupled to said drain of said first FET means, and a drain coupled to said first output terminal, and fifth inductor means coupled between said node between said first pair of inductor means and said gate of said first FET means, sixth inductor means coupled between said first and second FET means, and seventh inductor means coupled between said second FET means and said first output terminal; and
second switch means controllable for coupling selectively said input terminal to said second output terminal through said first pair of mutually coupled inductor means, said second switch means comprising third and fourth field effect transistor (FET) means coupled in series between said input terminal and said second output terminal, said third FET input terminal, and a drain, and said fourth FET means having a common gate connectable to the control means for receiving a control signal, a source coupled to said drain of said third FET means, and a drain coupled to said second output terminal, and eighth inductor means coupled between said node between said second pair of inductor means and said gate of said third FET means, ninth inductor means coupled between said third and fourth FET means, and tenth inductor means coupled between said fourth FET means and said second output terminal.

10. A matrix according to claim 9 wherein said FET means are all single-gate FETs.

11. A switch matrix, usable with control means generating switch control signals, comprising:
first and second input terminals and an output terminal;
first field-effect transistor (FET) switch means controllable for coupling selectively said first input terminal to said output terminal, and having two gates and a drain, a first of said gates of said first FET switch means being coupled to said first input terminal, the second of said gates of said first FET switch means being connectable to the control means for receiving a control signal, and said drain of said first FET switch means being coupled to said output terminal; and
second field-effect transistor (FET) switch means also having two gates and a drain, a first of said gates of said second FET switch means being coupled to said second input terminal, the second of said gates of said second FET means being connectable to the control means for receiving a control signal, and said drain of said second FET switch means being coupled to said output terminal.

12. A matrix according to claim 27 wherein each of said first and second FET switch means comprises a first dual-gate FET means.

13. A matrix according to claim 12 wherein each of said first and second FET switch means further comprise a second dual-gate FET means coupled in series with said first FET means, and having a first gate coupled to the drain of said first dual-gate FET means, a second gate connectable to the control means for receiving a control signal, and a drain coupled to said output terminal.

14. A matrix according to claim 11 wherein said first and second FET switch means each further comprises a pair of series-connected single-gate FET means, each having a gate, source and drain, with said gate of a first of said single-gate FET means being coupled to the respective one of said input terminals, said source of said first single-gate FET means being coupled to ground, said drain of said first single-gate FET means being coupled to said source of the second of said single-gate FET means, said gate of said second single-gate FET means being connectable to the control means for receiving a control signal, and said drain of said second single-gate FET means being coupled to said output terminal.

15. A matrix according to claim 14 wherein each of said FET switch means further comprises inductor means coupled in series between said drain of said first FET means and said source of said second FET means.

16. A matrix according to claim 11 further comprising a first inductor means coupling said drain of said first FET switch means to said output terminal, and a second inductor means coupling said drain of said second FET switch means through said first inductor means to said output terminal.

17. A matrix according to claim 16 further comprising third inductor means connected in series with said first and second inductor means for coupling said output terminal to ground, with said third inductor means being coupled to said output terminal through said first and second inductor means.

18. A matrix according to claim 16 further comprising third and fourth inductor means connected in series with said first and second inductor means for coupling said output terminal to ground, with said first and second inductor means being mutually coupled and said third and fourth inductor means being mutually coupled.

19. A switch matrix, usable with a control means generating switch control signals, comprising:
first and second input terminals and an output terminal;
first, second and third inductor means, and impedance means serially connected for coupling said output terminal to ground, with each pair of inductor means joining at a node;
first switch means controllable for coupling selectively said first input terminal to said output terminal, said first switch means comprising first and second field effect transistor (FET) means coupled in series between said first input terminal and said output terminal, said first FET means having a common source, a gate coupled to said first input terminal, and a drain, and said second FET means having a common gate connectable to the control means for receiving a control signal, a source coupled to said drain of said first FET means, and a drain coupled to said output terminal, and fourth inductor means coupled between said first input terminal and said gate of said first FET means, fifth inductor means coupled between said first and second FET means, and sixth inductor means coupled between said drain of said second FET means and said node between said first and second inductor means; and second switch means controllable for coupling selectively said second input terminal to said output terminal through said first and second inductor means, said second switch means comprising third and fourth field effect transistor (FET) means coupled in series between said second input terminal and said output terminal, said third FET means having a common source, a gate coupled to said second input terminal, and a drain, and said fourth FET means having a common gate connectable to the control means for receiving a control signal, a source coupled to said rain of said third FET means, and a drain coupled to said output terminal, and eighth inductor means coupled between said second input terminal and said gate of said third FET means, ninth inductor means coupled between said third and fourth FET means, and tenth inductor means coupled between said fourth FET means and said node between said second and third inductor means.

20. A matrix according to claim 19 wherein said FET means are all single-gate FETS.

* * * * *